US012754212B2

(12) United States Patent
Vangen et al.

(10) Patent No.: US 12,754,212 B2
(45) Date of Patent: Oct. 6, 2026

(54) LINE SENSOR COMPRISING A CAPACITIVE DIVIDER WITH INTEGRATED SLOT ANTENNA

(71) Applicant: Comrod AS, Tau (NO)

(72) Inventors: Knut Vangen, Sandvika (NO); Vidar Bakke, Jørpeland (NO)

(73) Assignee: Comrod AS, Tau (NO)

( * ) Notice: Subject to any disclaimer, the term of this patent is extended or adjusted under 35 U.S.C. 154(b) by 120 days.

(21) Appl. No.: 18/873,588

(22) PCT Filed: Apr. 20, 2023

(86) PCT No.: PCT/NO2023/050089
§ 371 (c)(1),
(2) Date: Dec. 10, 2024

(87) PCT Pub. No.: WO2024/005642
PCT Pub. Date: Jan. 4, 2024

(65) Prior Publication Data

US 2025/0321249 A1 Oct. 16, 2025

(30) Foreign Application Priority Data

Jul. 1, 2022 (NO) .................................... 20220762

(51) Int. Cl.
*G01R 15/16* (2006.01)
*G01R 15/06* (2006.01)
(Continued)

(52) U.S. Cl.
CPC ............. *G01R 15/16* (2013.01); *G01R 15/06* (2013.01); *G01R 27/2605* (2013.01);
(Continued)

(58) Field of Classification Search
CPC .... G01R 15/16; G01R 27/2605; G01R 15/06; H01Q 13/106; H01Q 13/10; H02J 50/001; H02J 50/05; H02J 50/70
(Continued)

(56) References Cited

U.S. PATENT DOCUMENTS 1,976,378 A 10/1934 Vrooman
2,030,491 A 2/1936 Abadie
(Continued)

FOREIGN PATENT DOCUMENTS

CA 2108178 A1 10/1992
CN 204012935 U 12/2014
(Continued)

OTHER PUBLICATIONS

Norwegian Search Report for No. 20191411, dated Mar. 24, 2020.
(Continued)

*Primary Examiner* — Raul J Rios Russo
(74) *Attorney, Agent, or Firm* — Andrus Intellectual Property Law, LLP

(57) ABSTRACT

A line sensor is for being mounted to a power line. The line sensor includes: i) a housing for containing line sensor electronics; and ii) a voltage-sensing capacitor in connection with the housing. The line sensor is characterized by an electric circuit connected in parallel with the first capacitance for receiving a harvested voltage standing over the two capacitor plates, the electric circuit being configured for operating in an energy harvesting mode and/or a voltage-sensing mode. The line sensor is further characterized by a slot antenna integrated in the first, upper, one of the capacitor plates, wherein in the second, lower, one of the capacitor plates an opening allows radio-frequency waves generated by the slot antenna to be transmitted through the opening. Thereby a single component multi-purpose structure is
(Continued)

formed enabling both the energy harvesting mode and the voltage sensing mode as well as wireless communication with other units.

17 Claims, 6 Drawing Sheets

(51) Int. Cl.

| | |
|---|---|
| ***G01R 27/26*** | (2006.01) |
| ***H01Q 13/10*** | (2006.01) |
| ***H02J 50/00*** | (2016.01) |
| ***H02J 50/05*** | (2016.01) |
| ***H02J 50/70*** | (2016.01) |

(52) U.S. Cl.
CPC ......... *H01Q 13/106* (2013.01); *H02J 50/001* (2020.01); *H02J 50/05* (2016.02); *H02J 50/70* (2016.02); *H01Q 13/10* (2013.01)

(58) Field of Classification Search
USPC .......................................................... 324/686
See application file for complete search history.

(56) References Cited

U.S. PATENT DOCUMENTS

| | | | | |
|---|---|---|---|---|
| 3,124,712 | A | 3/1964 | Alexander | |
| 4,808,917 | A | 2/1989 | Fernandes | |
| 4,839,567 | A | 6/1989 | Milton | |
| 4,886,980 | A | 12/1989 | Fernandes | |
| 6,677,743 | B1 | 1/2004 | Coolidge | |
| 8,160,825 | B1 | 4/2012 | Roe, Jr. | |
| 9,568,512 | B2 | 2/2017 | Divan | |
| 11,006,297 | B2 | 5/2021 | Higgins | |
| 11,499,994 | B2 | 11/2022 | Adachi | |
| 11,781,698 | B2 | 10/2023 | Fekrmandi | |
| 2008/0024321 | A1 | 1/2008 | Polk | |
| 2009/0303648 | A1* | 12/2009 | Benton | H02H 9/002 361/91.1 |
| 2010/0084920 | A1* | 4/2010 | Banting | G01R 19/2513 307/104 |
| 2011/0288777 | A1 | 11/2011 | Gupta | |
| 2012/0278011 | A1 | 11/2012 | Lancaster | |
| 2013/0064178 | A1 | 3/2013 | Cs | |
| 2013/0187636 | A1 | 7/2013 | Kast | |
| 2015/0022376 | A1 | 1/2015 | Zhang | |
| 2015/0331017 | A1 | 11/2015 | Raghunathan | |
| 2016/0061862 | A1 | 3/2016 | Nulty | |
| 2017/0227596 | A1 | 8/2017 | Sozer | |
| 2020/0049743 | A1 | 2/2020 | Keister | |
| 2020/0072814 | A1 | 3/2020 | Bailey | |
| 2022/0037886 | A1* | 2/2022 | Desmarais | G01R 19/2513 |

FOREIGN PATENT DOCUMENTS

| | | | |
|---|---|---|---|
| CN | 106312998 | A | 1/2017 |
| CN | 106786139 | A | 5/2017 |
| CN | 106992469 | A | 7/2017 |
| CN | 207053058 | U | 2/2018 |
| DE | 102020214614 | B3 | 5/2021 |
| EP | 1001271 | A1 | 5/2000 |
| NO | 20191123 | A1 | 3/2021 |
| WO | 2013123055 | A1 | 8/2013 |
| WO | 2019161088 | A1 | 8/2019 |
| WO | 2019171231 | A1 | 9/2019 |
| WO | 2020021802 | A1 | 1/2020 |
| WO | 2020035179 | A1 | 2/2020 |
| WO | 2021054841 | A1 | 3/2021 |

OTHER PUBLICATIONS

International Search Report and the Written Opinion for PCT/NO2020/050290, dated Mar. 9, 2021.
Search Report for Norwegian Patent Application No. 20220762, dated Dec. 5, 2022.
International Search Report and the Written Opinion for PCT/NO2023/050089, dated Sep. 4, 2023.
Response to the Written Opinion for PCT/NO2023/050089, dated Mar. 8, 2024.
Notice for PCT/NO2023/050089, dated Oct. 1, 2024.
Response to Notice for PCT/NO2023/050089, dated Oct. 14, 2024.
International Preliminary Report on Patentability for for PCT/NO2023/050089, dated Oct. 29, 2024.
Norwegian Search Report for NO 20191123, dated Feb. 24, 2020.
International Search Report and Written Opinion for PCT/NO2020/050239, dated Dec. 14, 2020.
Response to the Written Opinion for PCT/NO2020/050239, dated Jul. 6, 2021.
International Preliminary Report on Patentability for PCT/NO2020/050239, dated Aug. 16, 2021.
Peek's Law, found online via https://en.wikipedia.org/wiki/Peek%27s_law. Date Accessed: Dec. 10, 2024.
E. Kuffel, et al., High Voltage Engineering, Fundamentals, Second Edition, Pergamon Press 1984. p. 348.

* cited by examiner

LINE SENSOR COMPRISING A CAPACITIVE DIVIDER WITH INTEGRATED SLOT ANTENNA

CROSS-REFERENCE TO RELATED APPLICATIONS

This application is the U.S. national stage application of International Application No. PCT/NO2023/050089, filed Apr. 20, 2023, which international application was published on Jan. 4, 2024, as WO 2024/005642 in the English language. The International Application claims priority to Norwegian patent application No. 20220762, filed Jul. 1, 2022. The international application and Norwegian application are both incorporated herein by reference, in their entirety.

FIELD OF THE INVENTION

The invention relates to a line sensor for being mounted to a power line, the line sensor comprising: i) a housing for containing line sensor electronics; and ii) a voltage-sensing capacitor in connection with the housing, the voltage-sensing capacitor having two capacitor plates that are placed at a distance from each other for forming a first capacitance, wherein a first, upper, one of the capacitor plates is electrically connected with the power line, and a second, lower, one of the capacitor plates is electrically floating and forms a second, parasitic, capacitance with earth. The invention also relates to an improved line sensor having a voltage-sensing mode and/or an energy-harvesting mode and being that is less susceptible to corona discharge.

BACKGROUND OF THE INVENTION

Power distribution networks carrying power lines on mast constructions are found all over the world. In particular where these power lines are crossing rough or difficultly accessible areas it can be challenging to monitor the state of these power lines. Personnel may have to be sent on time-consuming, difficult and even dangerous hiking missions to inspect the network or fix problems like trees that have fallen on the lines, causing all kinds of problems like sparkover, breakage of power lines, etc. In order to solve these problems and challenges monitoring systems and line sensors have been reported in the prior art to provide for remote monitoring capability of power line networks.

In PCT patent application WO2021054841, owned by the same applicant, discloses a system for monitoring a power distribution network, wherein the power distribution network comprises a plurality of mast constructions placed on a ground at certain distances from each other and carrying at least one power line mounted to said mast constructions. The system comprises at least two smart modules, each smart module being affixed directly to a respective one of the plurality of mast constructions. The at least two smart modules are designed for wireless communication with each other in accordance with a wireless communication protocol for forming a main wireless communication network along the power line. The system further comprises at least one sensor system affixed directly to a respective one of said mast constructions, the at least one sensor system being designed for determining at least one quantity or event of the power distribution network and for communicating said at least one quantity or event to a respective smart module. The at least two smart modules are designed for communicating information associated with said at least one quantity or event along the main wireless communication network for being remotely monitored.

The system in WO2021054841A1 may be supplemented with line sensors that are mounted directly to the power lines.

Sensor equipment has been developed which most frequently is installed at a power line and that at least measures one or more electrical or mechanical properties of the power line wire. Many of the available solutions are in addition to sending information also arranged for being able to communicate a position and accurate time of events, and thereby report where and when a failure has occurred or is about to occur.

There are several challenges with line sensors that are mounted to power lines, namely:

i) how to energize (provide power to) them (even when the power line current is low or zero);
ii) how to detect the phase-to-ground voltage with a floating circuit, not physically-connected to ground; and
iii) how to integrate a high gain wireless antenna with low corona discharges.

Various technologies exist for solving these three challenges including energy harvesting technology, voltage sensing technology and body integrated antennas for aircraft. Quite a few voltage sensing technologies have been published so far of which a few are discussed below.

U.S. Pat. Nos. 1,976,378, 2,030,491, 3,124,712, 4,839,567 all disclose various examples and variations of how to harvest energy from the power line capacitive current to ground in order to power a luminescent lamp suspended from and at the power line potential.

U.S. Pat. No. 6,677,743B1 discloses a powerline sensor including a housing physically and electrically connectable to a powerline; a number of voltage sensing devices spaced peripherally about the housing, each voltage sensing device having an outer plate, an inner plate, and a dielectric material between the inner and out plates, the inner plates electrically connectable to the powerline, the outer plates electrically isolated form the powerline; and circuitry for sensing the voltage potential between the inner and outer plates to determine the voltage on the powerline.

U.S. Pat. No. 9,568,512B2 discloses a floating voltage sensor system comprising a metallic enclosure, a conductive sensor plate, a signal conditioning circuit, and a microcontroller unit. The metallic enclosure can be configured for electrical communication with an asset carrying a voltage. The conductive sensor plate can be positioned adjacent to a surface of the metallic enclosure, such that the conductive plate and the surface of the metallic enclosure are not in contact with each other. The signal conditioning circuit can comprise a first connection point and a second connection point. The first connection point can be in electrical communication with the conductive sensor plate. The second connection point can be in electrical communication with the metallic enclosure. The microcontroller unit can be configured to receive an output of the signal conditioning circuit and measure the voltage of the asset. The line sensor may further comprise a wireless transceiver having an antenna, which sticks out of the housing of the sensor system. The measured voltage may then be communicated Also, the document mentions that energy may be taken from the line using known techniques.

What these all the above-mentioned disclosures have in common is that for sensing line voltage they both use at least one (voltage-sensing) capacitor defined by electrodes that are spaced apart and of which one is connected to the line voltage and the other one is kept floating so as to form a voltage divider together with the parasitic capacitance to earth.

In view of the above-described challenges there is a need to further develop line sensor technology for solving the mentioned challenges better. There is also a continuous need to improve the communication capabilities of power line sensors.

SUMMARY OF THE INVENTION

The invention has for its object to remedy or to reduce at least one of the drawbacks of the prior art, or at least provide a useful alternative to prior art.

The object is achieved through features specified in the description below and in the claims that follow.

The invention is defined by the independent patent claims. The dependent claims define advantageous embodiments of the invention.

In a first aspect the invention relates to a line sensor for being mounted to a power line.

The line sensor comprises:

a housing for containing line sensor electronics; and a voltage-sensing capacitor in connection with the housing, the voltage-sensing capacitor having two capacitor plates that are placed at a distance from each other for forming a first capacitance, wherein a first, upper, one of the capacitor plates is configured to be electrically connected with the power line, and a second, lower, one of the capacitor plates is electrically floating and forms a second, parasitic, capacitance with earth. The line sensor is characterized by an electric circuit being connected in parallel with the first capacitance for receiving a harvested voltage standing over the two capacitor plates, the electric circuit being configured for operating in an energy harvesting mode and/or a voltage-sensing mode. The line sensor is further characterized by a slot antenna being integrated in the first, upper, one of the capacitor plates, the slot having two opposing short sides and two opposing long sides, the slot antenna comprising an input terminal at a first one of the long sides of the slot and an output terminal on a second one of the long sides of the slot, wherein in the second, lower, one of the capacitor plates an opening is provided for allowing radio-frequency waves generated by the slot antenna to be transmitted through the opening.

The effects of the features of the line sensor in accordance with the invention are as follows. The line sensor comprises a housing containing line sensor electronics, which are used for, amongst other functions, monitoring the power line. One of the things that the line sensor is supposed to determine is the line voltage on the power line. In order to do so the voltage-sensing capacitor is provided having two parallel plates, one of which being coupled with the power line (and carrying the power line voltage/potential) and the other one is kept floating and forms a parasitic capacitance with earth, so that a capacitive voltage divider circuit is formed between the power line and earth. As the voltage on the power line varies (carries a high-voltage AC signal, typically up to 180 kV in Norway), the voltage on the upper plate also carries this AC-voltage. Due to the voltage divider the voltage on the lower plate also varies (carries an AC signal), yet typically at a much lower amplitude. One could also say that the lower plate will carry a harvested voltage. Depending on the design this may be about 100V. In other words, when the voltage divider ratio is known one may determine the line voltage by measuring the voltage over the plates of the harvester capacitor. Alternatively, the harvested voltage may be used to power certain electronics. In order to allow at least one of these modes (harvester mode or voltage sensing mode), an electric circuit is provided which is connected in parallel with the first capacitance for receiving the harvested voltages standing over this capacitor, wherein the electric circuit is configured for operating in the energy harvesting mode and/or the voltage-sensing mode, that is one of said two modes, or both selectively.

As far as the shape of the capacitor plates is concerned, it must be noted that they may have any shape but should preferably be placed in the volume below the power line where the E field against ground is reasonably linear. Placing the plates up sideways or above has negative consequences as the plates start to be affected by E-fields from adjacent power lines that are shifted in phase compared to the selected power line. So each sector should be measured or harvested separately, not connected in series as has been reported in the prior art. Sectors of cylinders may also be used as capacitor plates as long as they are only the same width as the powerline. From there and outwards they have considerably lower capacitance per area to ground compared to a flat plate. A flat plate can be wider than the powerline and still have full capacitance per area. So, the flat plate can be extended beyond the width of the powerline and is the preferred shape and also the cheapest.

A remarkably interesting feature of the line sensor is that it further comprises a cavity backed slot antenna that is integrated in the first, upper, one of the capacitor plates, a slot of the slot antenna having two opposing short sides and two opposing long sides, the slot antenna comprising an input terminal at a first one of the long sides of the slot and an output terminal on a second one of the long sides of the slot. The inventor realized that is possible to implement such unidirectional slot antenna into one of the plates of a capacitor. That is a slot is formed into one of the plates having the shape described above. In the opposite plate an opening is required to be able to transmit radio frequency waves in that direction. Even though this effectively reduces the value of the capacitance, it allows to use the respective plate as slot antenna configured for wireless communication with other units. The detailed description will elaborate on why this is very advantageous in power line sensors, but at this point it is already mentioned that this slot antenna suffers from less disturbance by the power line than the existing antenna solutions and is also much more susceptible to corona discharges.

In order to facilitate understanding of the invention one or more expressions are further defined hereinafter.

Wherever the word "power line" is used, this must be interpreted as the conductor that is suspended between the masts and pylons of a power distribution network. Some may refer to such conductors as power line wire or a utility power line wire. This includes both high-voltage and low-voltage power line wires.

In an embodiment of the line sensor in accordance with the invention the electric circuit i) is configured for rectifying the harvested voltage to obtain a rectified harvested voltage and ii) for providing the rectified harvested voltage to the line sensor electronics in operational use so as to provide the energy harvesting mode. This embodiment constitutes a well-established way of enabling energy harvesting from the power line and enables the energy-harvesting mode as mentioned in claim 1.

In an embodiment of the line sensor in accordance with the invention the electric circuit is configured for measuring the harvested voltage for further handling so as to provide the voltage-sensing mode. This embodiment constitutes a well-established way of enabling voltage sensing and enables the voltage-sensing mode as mentioned in claim 1. In embodiments where both a voltage-sensing mode and an energy-harvesting mode the energy-harvester circuit is typically disconnected from the voltage-sensing capacitor in the voltage-sensing mode.

It is mentioned at this stage that the invention in accordance with claim 1 covers three different main embodiments of the line sensor:

1) A line sensor having a voltage sensing mode combined with wireless communication with other units;
2) A line sensor having an energy harvesting mode combined with wireless communication with other units;
3) A line sensor having an both a voltage-sensing mode and an energy harvesting mode combined with wireless communication with other units, wherein the line sensor can select in which mode it operates.

In an embodiment of the line sensor in accordance with the invention the slot antenna is rectangular extending within in a plane of the first, upper, capacitor plate, wherein the short sides of the slot antenna extend in a direction orthogonal to the power line. This embodiment constitutes a first main variant of the slot antenna. It was established that the principle of the invention works with a rectangular slot antenna.

In an embodiment of the line sensor in accordance with the invention the slot antenna is bow-tie shaped extending within in a plane of the first, upper, capacitor plate, wherein the short sides of the slot antenna extend in a direction orthogonal to the power line. This embodiment constitutes a second main variant of the slot antenna. It was established that the principle of the invention works even better with a bow-tie shaped slot antenna. Bow-tie shaped slot antennas have a wider frequency band and an improved impedance. More information on this advantage is provided in the detailed description of the figures.

An embodiment of the line sensor in accordance with the invention further comprises a printed-circuit board having an electrically-insulating substrate sandwiched between respective electrically-conductive layers, the electrically-insulating substrate forming the dielectric of the first capacitor, the first capacitor being integrated in the printed-circuit board by each capacitor plate being provided in a respective one of the metal layers and the slot antenna being integrated in only one of the metal layers. Printed-circuit board technology is multi-functional, well-established and conveniently allows for implementing parallel capacitor electrodes in different metal layers, etched patterns and openings in same metal layers and wire connection pads. In addition, the insulating material of the printed-circuit board can be conveniently used as dielectric. Furthermore, printed-circuit board technology allows the creation of vias through the insulating material, thereby connecting different layers with each other. More information on this is provided in the detailed description of the figures.

In an embodiment of the line sensor in accordance with the invention a top-side of the housing is pre-shaped so as to receive and align with the power line from which the line sensor is suspended in operational use. The pre-shaped form may be an elongated recess in which the power line is received, thereby keeping the line sensor oriented parallel with the power line.

In an embodiment of the line sensor in accordance with the invention the first capacitor with the slot antenna is placed in the housing such that the slot antenna is located right under and parallel with the power line in operational use of the line sensor. The placement right under the power line provides for the lowest distortion and interference with the electric fields generated by adjacent power line wires. More detailed information is provided in the detailed description of the figures.

In an embodiment of the line sensor in accordance with the invention the housing comprises electrically-insulating material on the outside. Having electrically-insulating material on the outside of the line sensor reduces the formation of corona, particularly when the housing is designed with rounded shapes as illustrated in the drawings of the current invention.

In an embodiment of the line sensor in accordance with the invention the inner side of the housing above slot antenna is provided with an electrically-conductive layer. This electrically-conductive layer may be subsequently used for various purposes as the next embodiments illustrate.

In an embodiment of the line sensor in accordance with the invention an electrically-conductive via is provided on the top side of the housing and extends through the electrically-insulating material for making the electrical connection between the electrically-conductive layer that may be connected to the first capacitor plate, and the power line. This embodiment enables the first purpose of the electrically-conductive layer and that is to form the electrical connection between the power line and that respective first capacitor plate, which resides at a location in the housing. It is the via which electrically connects the power line with the electrically-conductive layer. Then at other locations the electrically-conductive layer may be further electrically connected with the plates of capacitor in which the slot antenna is integrated, for using the printed-circuit board when present. The conductive layer and the connected first capacitor plate forms a Faraday cage connected to the powerline and protecting internal parts from the strong electric fields of the high voltage powerline. More details about these aspects are provided in the detailed description of the figures.

An embodiment of the line sensor in accordance with the invention further comprises vias in the printed-circuit board for connecting the first capacitor plate to the conductive layer on the inside of the housing for forming a Faraday cage around internal electronics and wiring for shielding against electric fields.

In an embodiment of the line sensor in accordance with the invention the bottom side of the housing located under the slot antenna is not provided with any electrically-conductive layer so as to allow radio-frequency waves to be transmitted through the lower part of the housing. It is desired to allow radio frequency waves to be transmitted through and received through the housing. Therefore, the housing should preferably not have an electrically conductive layer on the bottom side of the housing. More details about this are provided in the detailed description of the figures.

In an embodiment of the line sensor in accordance with the invention the electrically-conductive layer of the housing, the electrically-conductive via and the upper capacitor plate define an antenna cavity formed above the slot antenna, the antenna cavity being provided for reflecting radio-frequency waves that are emitted from the slot antenna in the direction of the power line, in operational use of the line sensor. This embodiment herewith effectively comprises what is called a cavity-backed slot antenna and is particularly advantageous in embodiments wherein the inside of the housing is provided with a conductive layer as this layer may then create the antenna cavity. The antenna cavity, when having the right dimensions, reflects radio frequency waves that are transmitted from the slot antenna towards the power line. More details about this are provided in the detailed description of the figures.

An embodiment of the line sensor in accordance with the invention further comprises an RF-transceiver circuit coupled with the slot antenna for allowing wireless communication with other units. RF-transceiver circuits are well-known as such and may be conveniently added to the line sensor to allow for wireless communication via the slot antenna. More details about this are provided in the detailed description of the figures.

BRIEF INTRODUCTION OF THE FIGURES

In the following is described an example of a preferred embodiment illustrated in the accompanying figures, wherein.

DETAILED DESCRIPTION OF THE EMBODIMENTS

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various systems, structures and devices are schematically depicted in the figures for purposes of explanation only and so as to not obscure the present disclosure with details that are well known to those skilled in the art. Nevertheless, the attached figures are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The invention will be discussed in more detail with reference to the figures. The figures will mainly be discussed in as far as they differ from previous figures.

Figure 1:
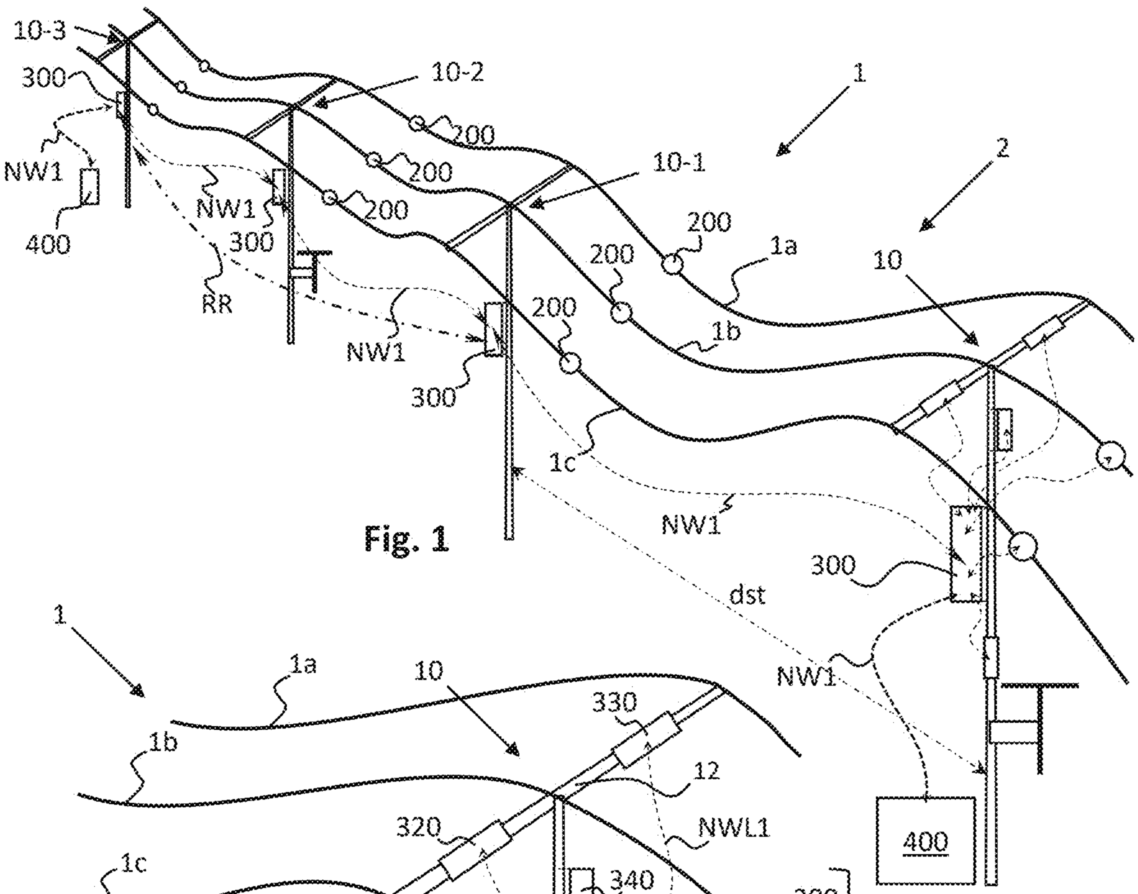
FIG. 1 shows a system for monitoring a power distribution network.
Figure 2:
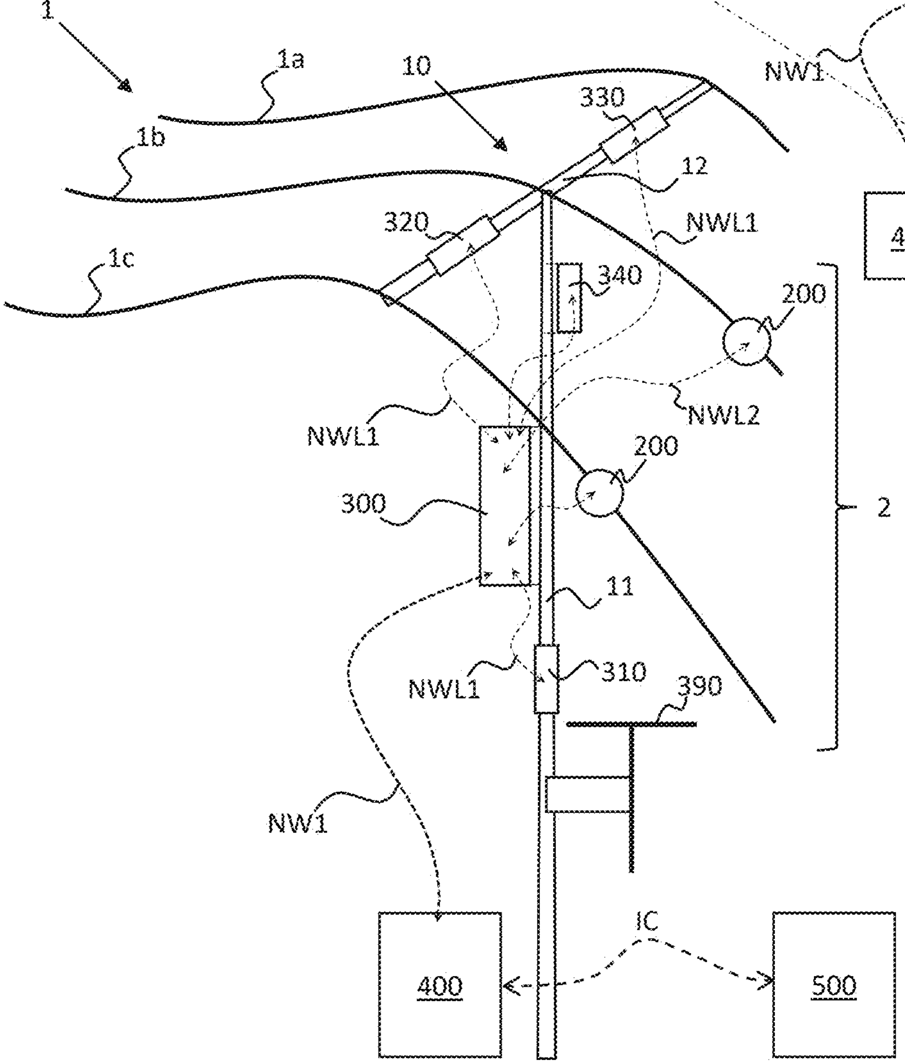
FIG. 2 shows an enlarged view of part of the system of FIG. 1.

FIG. 1 shows a system 2 for monitoring a power distribution network 1 in which the invention may be used. FIG. 2 shows an enlarged view of part of the system of FIG. 1. The power distribution network 1 comprises a plurality of mast constructions 10, 10-1, 10-2, 10-3, which are placed at certain distances dst from each other. For the sake of simplicity, the topology of the environment has not been drawn. In practice however, the power distribution network 1 may cross rough or difficultly accessible areas, including mountains, forests and hills. It is particularly in such areas that the invention is useful, as will be explained further with reference to the figures. The plurality of mast constructions 10, 10-1, 10-2, 10-3 carry three power lines 1*a*, 1*b*, 1*c* in this example embodiment. The power lines 1*a*, 1*b*, 1*c* are typically suspended in crossbars 12 through isolators (not shown). Such isolators are well-known in the field of power distribution networks and are therefore not further discussed. The crossbars 12 are each connected to a respective mast 11 as illustrated. In the current example there is only one crossbar 12 per mast 11, but there may also be more than one crossbar or even no crossbar 12 at all (in case there is only one power line for example). The number of crossbars 12 depends on the amount of power lines 1*a*, 1*b*, 1*c* that are to be distributed. There is a huge variety of mast constructions known from the prior art. The invention is applicable to any kind of mast construction.

In the monitoring system 2 smart modules 300 are affixed directly to the mast constructions 10 as FIG. 2 clearly illustrates. It may be one smart module per mast construction 10 as in FIG. 1 or some mast constructions may be skipped. The inventor's insight in WO2021054841A1 that, while it was known to provide for monitoring intelligence in line sensors that are mounted directly on the power lines, this monitoring can, to a great extent, be performed from a monitoring system 2 that is affixed directly on the mast construction 10. This relatively simple measure greatly reduces the challenges that come along with providing said system only on the power lines. This is discussed in detail in the introduction of WO2021054841A1. The smart module 300 forms a main ingredient of the monitoring system 2 of FIG. 1. As will be elaborated upon later the smart module 300 may contain computation power, energy supply, memory, but also sensors, because many of the quantities or events of the power distribution network 1 may be directly determined at or in the mast construction 10.

A first main function of the smart module 300 is to create a main wireless communication network NW1 along the power lines 1*a*, 1*b*, 1*c*, i.e. each smart module 300 may communicate with another smart module 300 along the path of the power lines as the dashed arrows illustrate. In an embodiment the main wireless communication network NW1 forms a wireless mesh network, i.e. mesh WIFI. The distance dst between and placement of said construction masts 10 is chosen such that there is “redundancy” built-in in that respective smart modules 300 may also reach non-neighbouring smart modules, i.e. hop over one or more smart modules. This node hopping or rerouting is illustrated by a dash-dot arrow RR. The smart modules 300 may also communicate with data concentrators or gateways 400 as FIGS. 1 and 2. illustrate. These gateways 400 allow for connection to the internet, which may be wired or wireless. FIG. 2 illustrates that the gateways ensure connection between the smart modules 300 and a data centre 500. Between the gateway 400 and the data centre 500 the internet connection IC is symbolically illustrated by a dashed arrow.

A second main function of the smart module 300 is connecting with a sensor system 310, 320, 330, 340, which is configured for determining at least one quantity or event of the power distribution network 1. This sensor system may be comprised in a same housing of the smart module 300 or it may have its own housing and be affixed to another part of the mast construction 10. In FIG. 2 there is mounted a first sensor system 310 directly on the mast 11 of the mast construction 10. The first sensor system 310 may comprise a tension or compression sensor for example, which is configured for determining bending of the mast 11, for example because of a tree or the wind. Alternatively, the first sensor system 310 may comprise an acceleration sensor for determining acceleration or vibrations of the mast construction.

A third main function of the smart module 300 is to communicate information associated with said at least one quantity or event along the main wireless communication network NW1. Information associated with said at least one quantity or event may be obtained by processing the determined quantity or event inside the smart module, which may comprise parts like a processor unit, memory and energy management unit. The whole purpose of the monitoring system 2 is to get the relevant information to the data centre, which is remote from the power distribution network 1. Based upon this information the necessary actions may be initiated, such as maintenance or repair operations in the power distribution network 1.

In FIG. 2 there is mounted a second sensor system 320 and a third sensor system 330 directly on the crossbar 12 of the mast construction 10. Just like the first sensor system 310 these sensors systems 320, 330 may comprise a tension or compression sensor for example, which is configured for determining bending of the crossbar 12, for example because of a tree or the wind. Alternatively, these sensor systems 320, 330 may comprise an acceleration sensor for determining acceleration or vibrations of the crossbar 12. The sensor systems 320, 330 may also be mounted between the isolators (not shown) and the power lines 1*a*, 1*b*, 1*c*. Alternatively, the sensor systems 320, 330 may be mounted on/at the attachment points of the isolators (not shown) to the crossbar 12. In such cases these sensor systems 320, 330 may comprise acceleration or vibration sensors, compression or tension sensors, but also temperature sensors.

In the embodiment of FIG. 2 there is mounted a fourth sensor system 340 directly on the mast 11 yet here a bit closer to the power lines 1*a*, 1*b*, 1*c*. The fourth sensor system 340 may comprise a sparkover sensor as earlier discussed. As is known from the prior art, multiple sparkover sensors 340 may cooperate to determine the location of a sparkover between power lines 1*a*, 1*b*, 1*c* or between a respective power line and ground. Alternatively or additionally, the fourth sensor system 340 may comprise a camera for optical inspection of the power distribution network 1 including the power lines 1*a*, 1*b*, 1*c*.

Even though the core idea of the monitoring system 2 is to provide “intelligence” or “smartness” directly on the mast construction 10, the monitoring system 2 may still be supplemented with line sensors 200 as illustrated, i.e. line sensors are not necessarily excluded. These line sensors 200 may be configured with further sensors, such as current sensors (voltage-sensing techniques), temperature sensors, acceleration or vibration sensors, inclination sensors, compression or tension sensors, or sparkover sensors. These line sensors 200 may be complex devices, which are hanged on or suspended from the power lines 1*a*, 1*b*, 1*c*, or they are mounted directly on an insulator that is fixed to the power line 1*a*, 1*b*, 1*c*. Nevertheless, the insight of WO2021054841A1 is that many of these sensors may be affixed directly to the mast construction 100 as it will be easier to implement in a robust and convenient way.

In the embodiment of FIGS. 1 and 2 some of the mast constructions 10, 10-2 have been provided with a weather station 390 connected to the smart module 300 (connection not shown, may be wired or wireless), which is symbolically illustrated with a T-shape. The weather station 390 is preferably placed lower on the mast constructions 10, 10-2 because of the risk of being hit by lightning.

The embodiment of FIG. 2 also illustrates that the connections between said smart module 300 and the sensors 310, 320, 330, 340, 200 and weather station 390 is formed by one or more local wireless communication networks NWL1, NWL2. Alternatively, (some of) these connections may be wired.

It must be noted that the monitoring system 2 in accordance with FIGS. 1 and 2 may comprise:

- the smart modules 2 on the mast constructions 10, 10-1, 10-2, 10-3 (including at least one sensor system);
- the sensor systems 310, 320, 330, 340 on the mast constructions (if present);
- the line sensors 300 on the power lines 1*a*, 1*b*, 1*c* (if present);
- the weather stations 390 (if present).

The embodiments of the invention described hereinafter are about mounting a line sensor on a power line under live line conditions, i.e. live line operations. In WO2021054841A1 it is disclosed how to use a robot to do the job, particularly a robot, which can climb in a double rope that is suspended between the ground and the power line.

Figure 3:
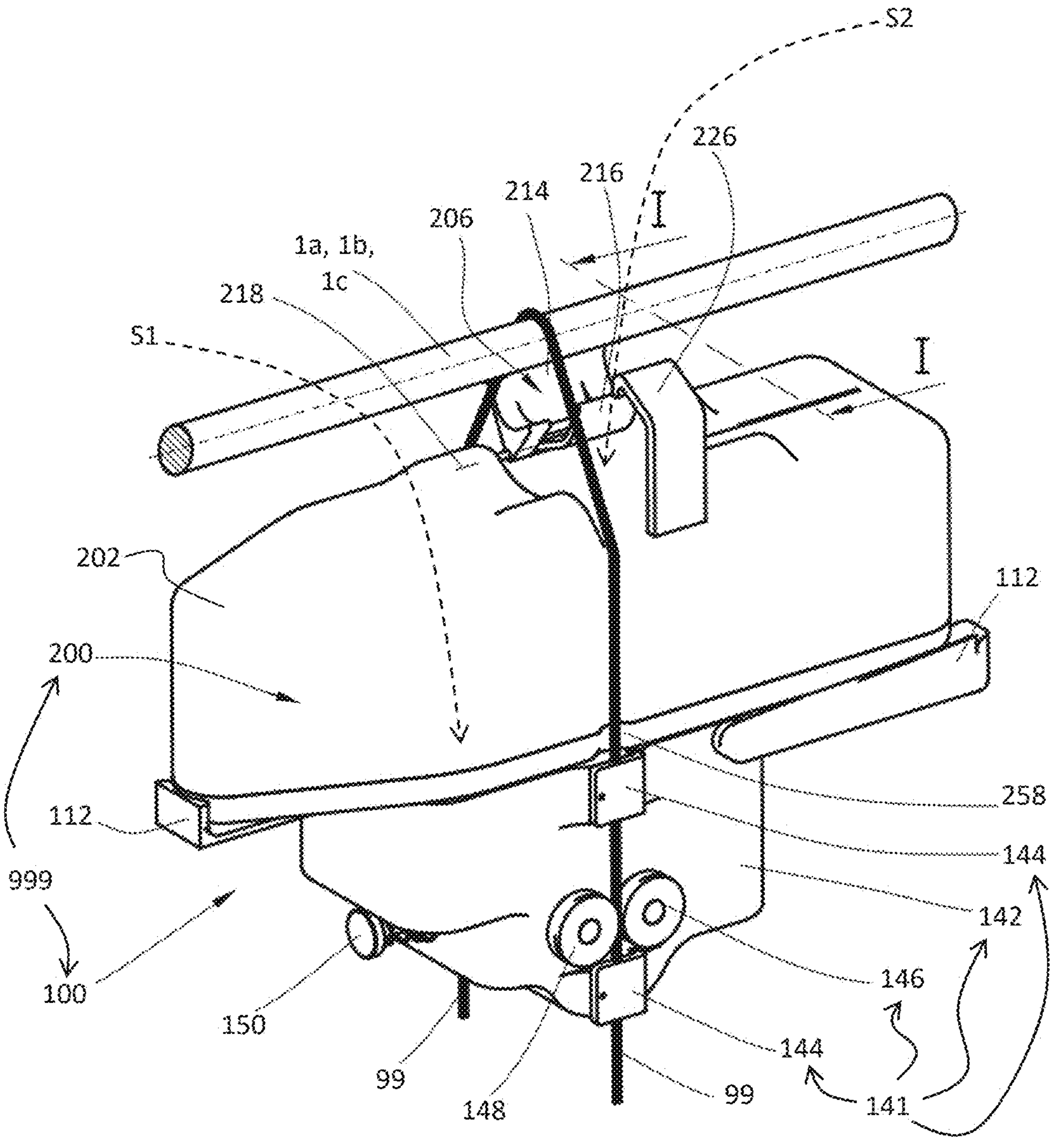
FIG. 3 shows a perspective view oblique from above of an assembly of a rope robot with a line sensor in a position shortly before mounting of the line sensor to a power line.

FIG. 3 shows a perspective view oblique from above of an assembly 999 of a rope robot 100 with a line sensor 200 in a position shortly before mounting of the line sensor 200 to a power line 1*a*, 1*b*, 1*c*.

FIG. 3 shows part of a live line rope 99 that is hung over the power line 1*a*, 1*b*, 1*c* as illustrated. A live line rope 99 typically comprises an electrically-insulating material and also satisfies the requirements for moisture intrusion set by the standards for live line work. The rope robot 100 has been provided with the line sensor 200 on its upper surface S1, wherein the line sensor 200 is releasable from the rope robot 100. In order to facilitate holding of the line sensor 200 the rope robot 100 is provided with a support unit 112, which will be further explained with reference to other figures. The most important function of the support unit 112 is to confine the line sensor 200 during climbing along the rope 99 in that the line sensor 200 cannot slide on the rope robot 100 and fall on the ground. In an alternative embodiment (not shown)

the robot 100 grips or clamps the line sensor 200, which provides another way of holding the line sensor such that it cannot fall. The rope robot 100 and the line sensor 200 form the assembly 999 during upward (when mounting) or downward climbing (when demounting) of the rope robot 100 along the rope 99 and during connection and disconnection of the line sensor 200 and the power line wire 1*a*, 1*b*, 1*c*.

The line sensor 200 is prepared for being mounted to the power line 1*a*, 1*b*, 1*c*. The line sensor 200 has been provided with an attachment mechanism 206 on an upper side S2 of a line sensor housing 202 as illustrated. The attachment mechanism 206 is configured for releasable connection with the power line 1*a*, 1*b*, 1*c*. The line sensor 200 also comprises a locking mechanism 226.

As mentioned before, the line sensor 200 is releasable from the rope robot 100 and is held in mutually correct position by the support unit 112, but also by gravity force and a shaft coupling 138 between the rope robot 100 and the line sensor 200, which will be discussed later. The attachment mechanism 206 of line sensor 200 comprises a main attachment arm 214 and an auxiliary attachment arm 216 as illustrated in FIG. 3. The main attachment arm 214, referred to as rotatable arm, is arranged to be able to rotate about an attachment arm shaft 218 between an open position as shown in FIG. 3, and a closed position where it rests against the power line 1*a*, 1*b*, 1*c*. The main attachment arm 214 is provided with a lower tip 220 to facilitate the closing action. The auxiliary attachment arm 216 is angular shaped and is in this embodiment also rotatable about the same attachment arm shaft 218. A lower tip 222 of the auxiliary attachment arm 216 is arranged to be pressed against the power line 1*a*, 1*b*, 1*c*, wherein an upper tip 224 of the auxiliary attachment arm 216 thereby rotates and presses the main attachment arm 214 to rotate in the same direction in a closing direction. The upper tip 224 of the auxiliary attachment arm 216 acts as a rocker.

The earlier mentioned locking mechanism 226 comprises a locking arm as illustrated. The locking arm 226 is displaceable between an open position as shown in FIG. 3, and a closed position where it is hooked into the main attachment arm 214. Refer to Fig., the locking arm 226 is provided with a rack rail which is in engagement with a gear (not shown). The gear is located inside the line sensor housing 202 and is rotatable about a gear shaft axis shared with a worm gear. The worm gear is driven by a worm shaft. The worm shaft is drivable via a releasable shaft coupling 138 by an (electrical) manipulation motor (attachment motor), both forming part of a manipulator unit of the rope robot 100. The shaft coupling can for example be a so-called claw or jaw shaft coupling. The worm gear and the worm shaft may be self-locking.

The rope robot 100 is also arranged with a rope robot housing 142. The earlier-mentioned support arms 112 are attached to the rope robot housing 142. Furthermore, rope guides 144 are provided at two sides of the rope robot housing 142 for guiding the rope 99. As illustrated the rope 99 is arranged on both sides of the rope robot housing 142 between a rope drive wheel 146 and a rope clamping wheel 148 on each side of the housing 142. The clamping force on the rope 99 may be adjusted via a rope clamping adjustment screw 150 as illustrated. The rope drive wheels 146 are driven via a shaft and two bevel gears by an (electrical) rope climbing motor 156.

The line sensor housing 202 is arranged with rope guide recesses for the rope 99, see FIG. 3. The rope guide recesses are arranged to contribute to the line sensor housing 202 aligning properly with the power line wire 1*a*, 1*b*, 1*c* when the line sensor 200 is pressed against the power line wire 1*a*, 1*b*, 1*c*.

The claims refer to rope robot 100 having a crawler unit 141. The crawler unit 141 is defined as all parts that contribute to climbing up and down the rope 99, that is the rope climbing motor, the wheels 146, 148, the rope guides 144, the wheel shaft and the bevel gear.

The rope climbing motor and the manipulation motor may be powered by a battery and electronic motor drives. Both motors may be controlled from the ground by pulling a separate control rope (not shown) attached under the rope robot 100 arranged with a control rope force sensor. Alternatively, this may be done by wireless communication, or even by an (on-board) autonomous rope robot control system. The control rope may be the same type as the rope 99.

When a line sensor 200 is prepared for mounting to a power line 1*a*, 1*b*, 1*c*, the rope 99 is first arranged over the power line wire 1*a*, 1*b*, 1*c*. Then the two resulting rope ends are attached to the ground and subsequently entered into their corresponding (openable) rope guides 144 and in between their corresponding rope driving wheels 146 and rope clamping wheels 148. The adjustment screw 150 is adjusted if necessary to provide required frictional force against the rope 99.

When the rope robot 100 is aligned, the line sensor 200 can be placed on the support unit 112 of the rope robot 100, whereby the shaft coupling 138 is engaged with the attachment motor 140. The climbing motor is started and lifts the assembly 999 up towards the power line wire 1*a*, 1*b*, 1*c*. The attachment mechanism 206 is then in its open position as shown in FIG. 3.

When the assembly 999 is offset further against the power line 1*a*, 1*b*, 1*c*, the lower tip 222 of the auxiliary attachment arm 216 is pressed against the power line 1*a*, 1*b*, 1*c*. A further offset of the assembly 999 against the power line wire 1*a*, 1*b*, 1*c* rotates the auxiliary attachment arm 216 about the attachment arm shaft 218, pressing the auxiliary attachment arm's upper tip 224 against the main attachment arm 214.

Figure 4:
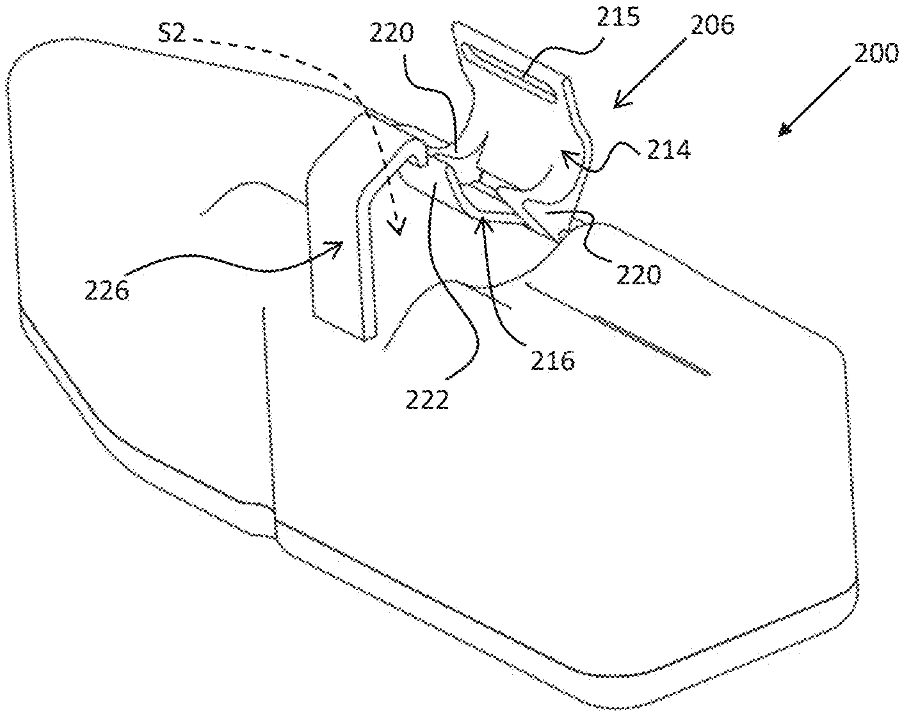
FIG. 4 shows a perspective view of an embodiment of the line sensor in accordance with the invention.

FIG. 4 shows a perspective view of an embodiment of the line sensor 200 in accordance with the invention. FIG. 4 mainly serves to illustrate how the upper side S2 of the line sensor 200 is prepared with the attachment mechanism 206 and the locking mechanism 226. All the earlier discussed parts 214, 216, 220, 222 in connection with the attachment mechanism 206 are clearly visible in terms of their shape, interaction and location. A locking hole 215 is also clearly visible in the main attachment arm 214 (rotatable arm). This locking hole 215 is designed to receive the locking member 216.

Figure 5:
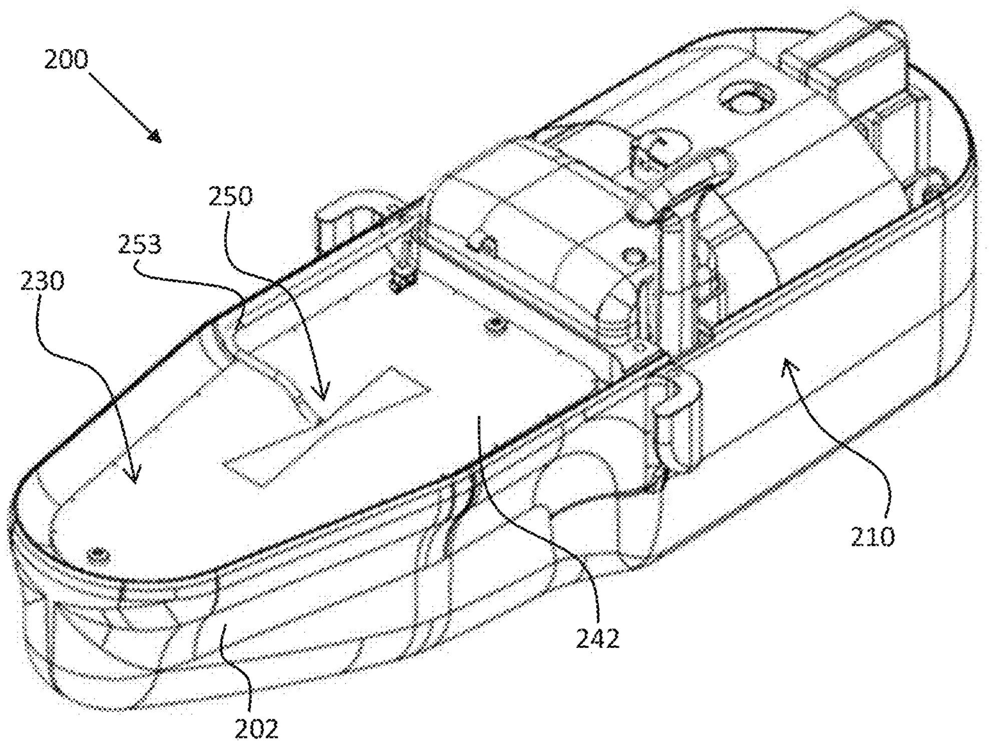
FIG. 5 shows a perspective view of the top side of the line sensor with part of the housing removed such that the printed-circuit board inside of the housing is visible.

FIG. 5 shows a perspective view of the top side of the line sensor 200 with top part of the housing 202 removed such that the (earlier-discussed) printed-circuit board 230 inside of the housing 202 is visible. The printed circuit board 230 is provided in a front (lower left) section of the line sensor 200, wherein the front section is defined as the section which due do its shape points towards the mast, usually upwards and away from the midpoint between masts. In the rear section there are provided line sensor electronics 210 (not visible in FIG. 5, but in FIG. 6). In FIG. 5 the printed-circuit board is seen from the top side, wherein a first, upper, capacitor electrode 242 is visible, in which a slot antenna 250 is integrated and being electrically coupled to an RF-transceiver circuit (not shown) via an RF-feed cable 253 as illustrated. More details about the slot antenna 250 and the RF-feed cable 253 will be given with reference to other figures.

Figure 6:
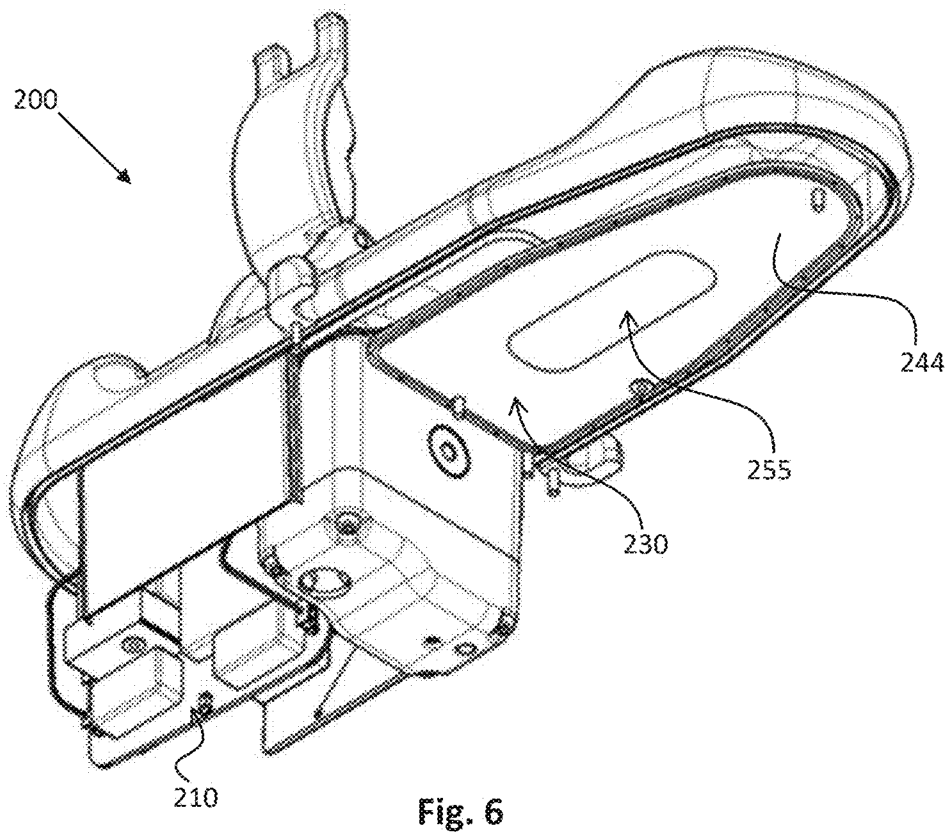
FIG. 6 shows another perspective view of the bottom side of the line sensor with part of the housing removed such that other side of the printed-circuit board is visible.

FIG. 6 shows another perspective view of the bottom side of the line sensor 200 with a bottom part of the housing 202 removed such that a bottom side of the printed-circuit board 230 is visible. In this figure, the printed-circuit board 230 is seen from the bottom side, wherein a second, lower, capacitor electrode 244 is visible, in which an opening 255 is provided as illustrated. The opening 255 serves as a window for the slot antenna 250 to operate in a downward direction. The earlier-mentioned line sensor electronics 210 in the rear section of the line sensor 200 are clearly visible.

Figure 7:
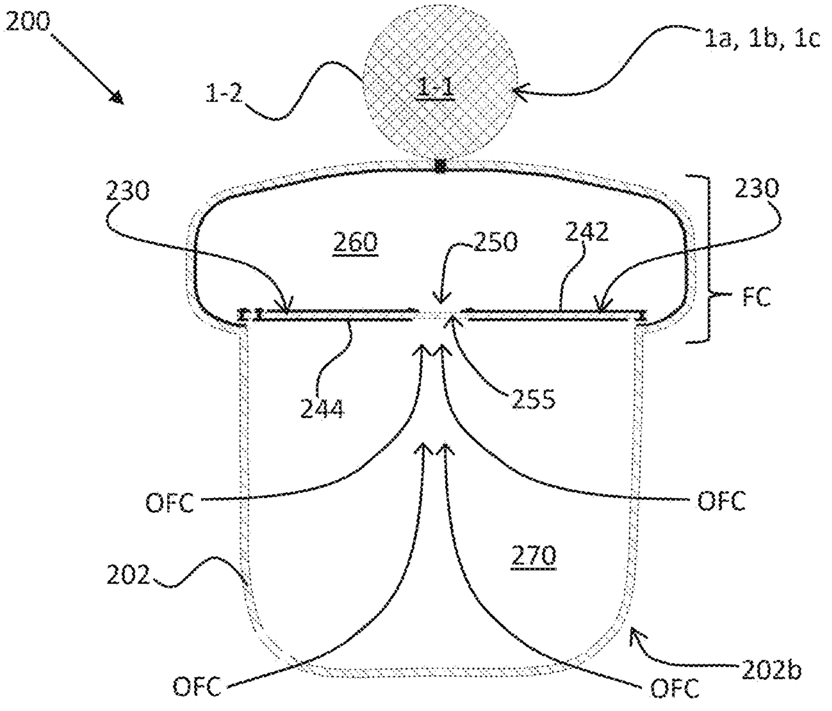
FIG. 7 shows a simplified cross-sectional view of the line sensor of FIG. 4 when suspended from a power line.

FIG. 7 shows a simplified cross-sectional view of the line sensor 200 of FIG. 4 when suspended from a power line 1*a*, 1*b*, 1*c*. The figure illustrates how the housing 202 and the printed-circuit board 230 together define an upper volume 260, which is designed to function as antenna cavity. Also, the housing 202 and the printed-circuit board 230 together define a lower compartment 270 at the bottom side 202*b* of the housing 202 as illustrated. In order for the upper volume 260 to function as antenna cavity it is necessary to design it as a Faraday cage FC. The printed-circuit board 230 comprises at its side facing the antenna cavity 260 the slot antenna 250 in the first capacitor plate 242 and at its side facing the lower compartment 270 the opening 255 in the second capacitor plate 244. The lower compartment is not part of the Faraday cage and effectively forms an opening in the housing 202 from an RF-perspective as illustrated by the arrows OFC. Expressed differently, the lower part of the housing 202 is designed to be transparent for RF waves.

Figure 8:
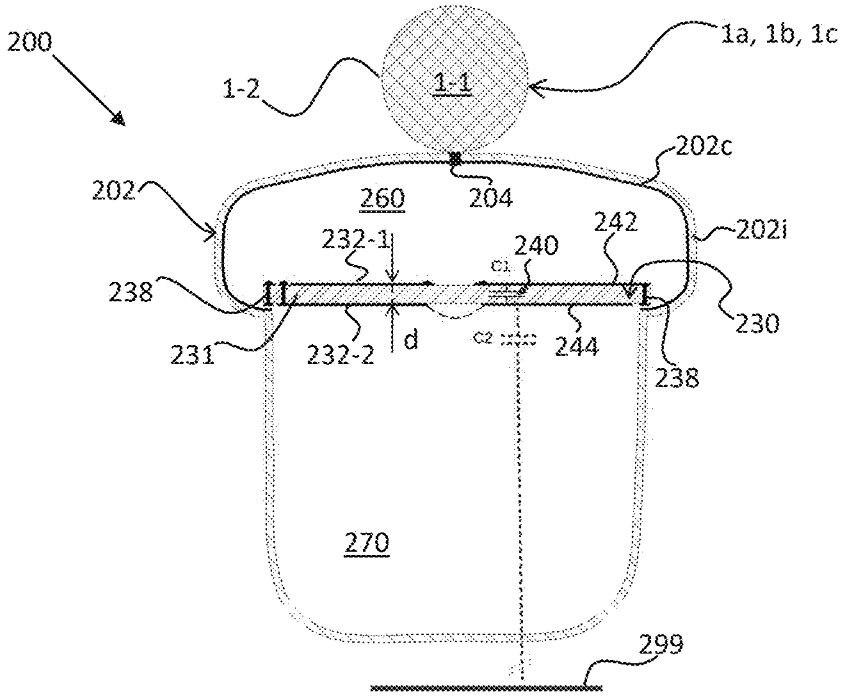
FIG. 8 illustrates some further aspects of FIG. 7.

FIG. 8 illustrates some further aspects of FIG. 7. This figure illustrates how the printed-circuit board 230 comprises an electrically-insulating substrate 231 that is sandwiched between a first electrically-conductive layer 232-1 and a second electrically-conductive layer 232-2. The first electrically-conductive layer 232-1 defines the first, upper, capacitor plate 242 and the second electrically-conductive layer 232-2 defines the second, lower, capacitor plate 244, said plates 242, 243 together defining a harvester capacitor 240. The thickness of the substrate 231 defines the distance d between the capacitor plates 242, which define a first capacitance C1 of the harvester capacitor 240. The lower capacitor plate 244 defines together with earth 299 a second capacitance C2. The second capacitance C2 is a parasitic capacitance. However, this parasitic capacitance C2 may be conveniently exploited for both voltage-sensing and energy-harvesting applications as is well-known in the art. The idea behind this is that the first capacitance C1 and the second capacitance C2 together form a capacitive voltage divider. This means that if the first capacitor plate 142 of the harvester capacitor 140 is provided with the power line voltage, that the lower capacitor plate 144 (if it is kept floating) will carry an attenuated version of the power line voltage in accordance with the capacitive voltage divider ratio. This is well-known as such and not further elaborated upon for that reason.

In FIG. 8 it is also illustrated that the antenna cavity 260 is formed by coating the inside of the housing (which is made of an electrically-insulating material 202*i*) with an electrically-conductive layer 202*c*. This electrically-conductive layer 202*c* also has the function of acting as electrical connection between (an electrically-conductive core 1-1 of) the power line 1*a*, 1*b*, 1*c* and the first capacitor plate 142 as illustrated. In order to establish this connection an electrically-conductive via 204 is provided that extends between the power line 1*a*, 1*b*, 1*c* and the electrically-conductive layer 202*c* on the inside of the housing as illustrated. The via 204 extends through the electrically-insulating outer layer 202*i* of the housing. Also further vias 238 are provided which extend through the printed-circuit board 230 as illustrated. These further vias 238 establish a connection of the first capacitor plate 242 and the back side of the printed-circuit board that is in electrical contact with the electrically-conductive layer 202*c* on the inside of the housing 202.

Even though energy-harvesting and voltage sensing using a voltage-sensing capacitor is known for power lines it is not known to integrate a slot antenna in the voltage-sensing capacitor, which may be used for wireless communication with other units.

Figure 9:
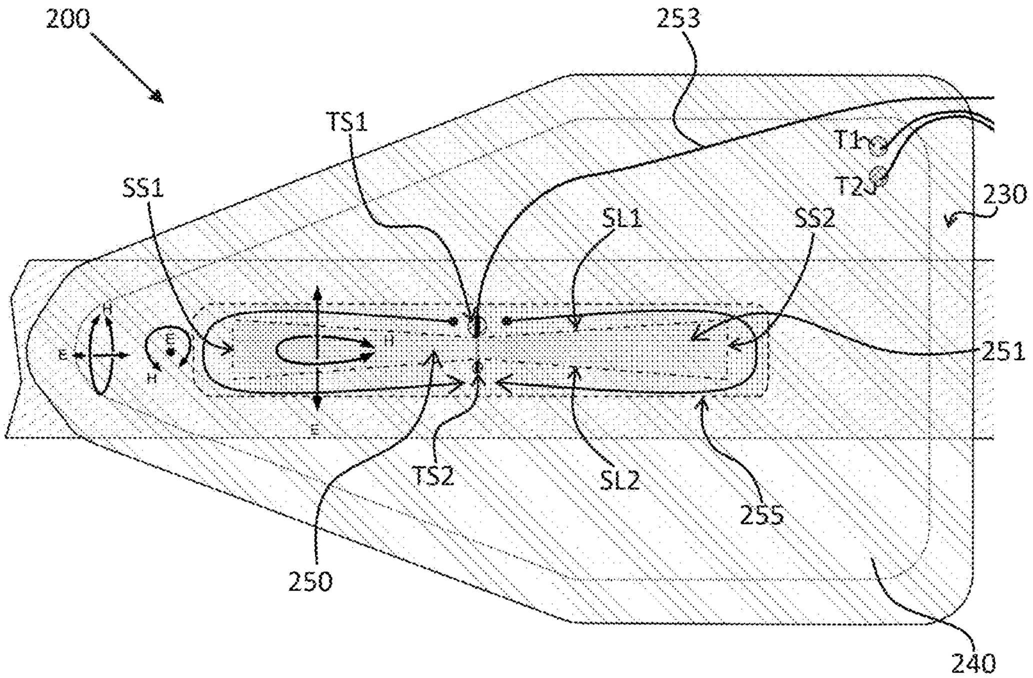
FIG. 9 illustrates the slot antenna in accordance with the invention and why the slot antenna is advantageous.

FIG. 9 illustrates the slot antenna 250 in accordance with the invention and why the slot antenna 250 is advantageous. This figure shows that the slot antenna 250 is formed by a providing a slot 251 in the electrically conductive first, upper, capacitor plate 242. The slot 251 is bow-tie shaped in this embodiment, but it could also be rectangular. The slot 251 is elongated having two, opposing, short sides SS1, SS2, and two, opposing, long sides SL1, SL2 as illustrated. In the middle of one long side SL1 there is provided a negative RF-feed negative terminal TS1 of the slot antenna, and in the middle on the opposite long side SL2 there is provided a positive RF-feed terminal TS2. These two terminals TS1, TS2 are connected to a RF transceiver circuit. Such circuits are, as such known, and not elaborated upon in detail in this specification. The elongated direction of the slot antenna 250 extends in a direction parallel to the power line 1*a*, 1*b*, 1*c* in operational use of the line sensor. In addition, the slot antenna 250 is located right under the power line 1*a*, 1*b*, 1*c* as illustrated. Now, when the slot antenna 250 is being used for wireless communication, RF current will run between the terminals TS1, TS2 as illustrated by the arrows and that is where it gets remarkably interesting. The current contributions on the long sides SL1, SL2, when designed properly substantially cancel each other out, meaning there is hardly interference between these currents and the power line current. The current contributions on the short sides SS1, SS2 do not cancel each other out, yet the respective electric and magnetic fields E, H associated with these current contributions are oriented substantially perpendicular to the electric and magnetic fields E, H associated with the power line current. This means that also for these parts there is hardly interference between these currents and the power line current. This is an advantage of using a slot antenna and particularly when oriented in the illustrated direction and designed as illustrated.

FIG. 9 further shows a coaxial antenna cable 253 (transmission cable) that is connected with the respective terminals TS1, TS2. The core of the transmission cable 253 is connected with the second terminal TS2 and the sleeve of the transmission cable 253 is connected with the first terminal TS1.

FIG. 9 also shows a first terminal T1 for allowing electrical connection with the first, upper, capacitor plate 242 and a second terminal T2 for allowing electrical connection with the second, lower capacitor plate 244 by a via extending through the substrate.

Figure 10:
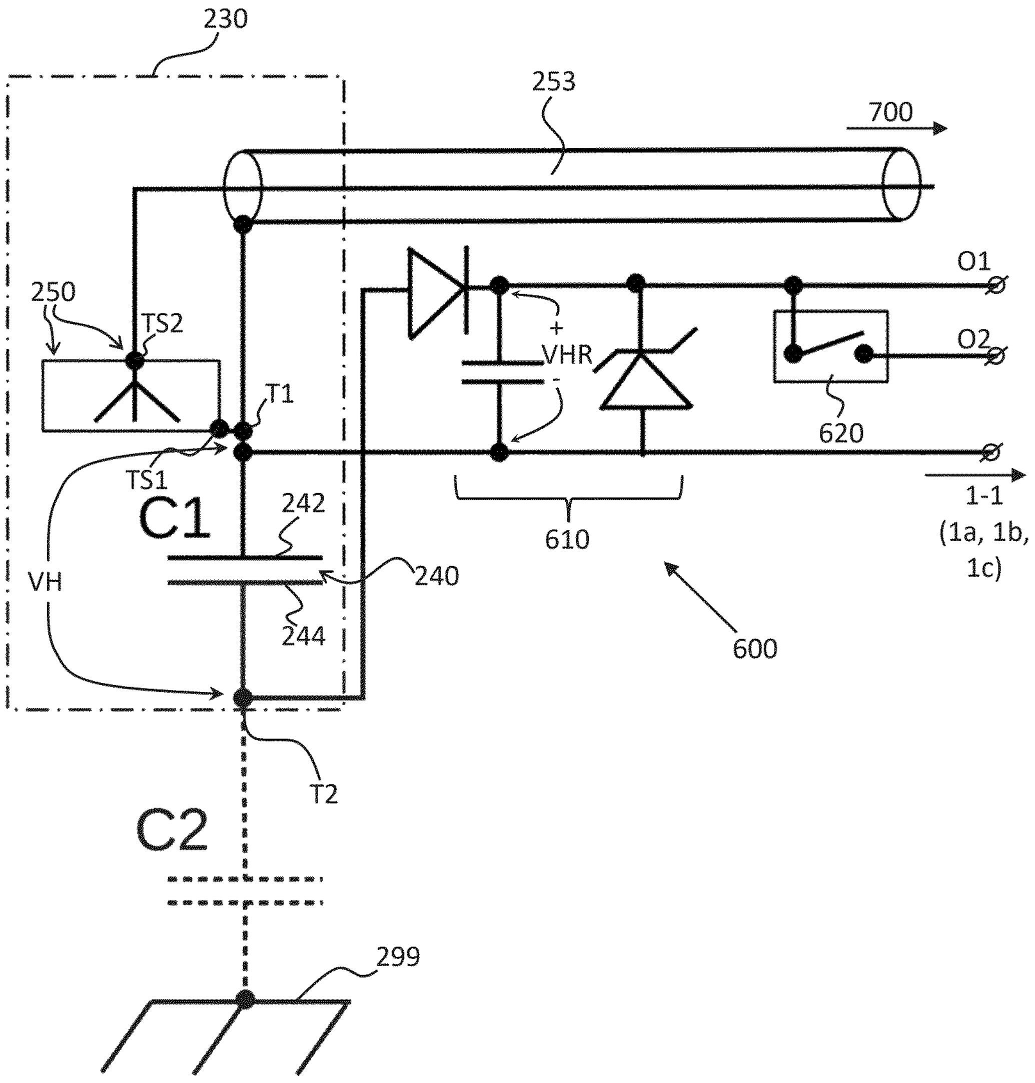
FIG. 10 shows an electrical schematic of part of the line sensor in accordance with the invention.

FIG. 10 shows an electrical schematic of part of the line sensor 200 in accordance with the invention. In order to enable all of the mentioned purposes including energy-harvesting, voltage sensing and wireless communication, electric circuits are necessary. For the energy-harvesting mode and the voltage-sensing mode the voltage-sensing capacitor 240 is required. The first terminal T1 (first, upper, capacitor plate 242) of this capacitor 240 is connected with the electrically-conductive core 1-1 of the power lines 1*a*, 1*b*, 1*c* as illustrated. The second terminal T2 (second, lower, capacitor plate 244) of this capacitor 240 is electrically floating and fed into a rectifier circuit 610, which is schematically illustrated. The voltage-sensing capacitor 240 carries a harvested voltage VH as illustrated, which is typically an AC-signal of about 100V. The rectifier circuit 610 receives this harvested voltage VH and transforms this into a rectified harvested voltage VHR. This harvested voltage VHR may be directly fed to voltage-sensing circuit via a first output O1 as illustrated or it may be applied to a further energy-harvesting circuit via a second output O2. In order to be able to select between the energy-harvesting mode and the voltage-sensing mode (which normally are not done simultaneously) a switching circuit 620 may be provided as illustrated. In this example the switching circuit is only provided in the branch connected to the second output. However, alternatively a similar circuit may be provided in the branch connected to the first output or a more sophisticated switching circuit may be provided connecting both branches selectively to their outputs O1, O2

FIG. 10 also illustrates how the respective terminals of the slot antenna are connected with other parts of the electric schematic. In fact it is a bit challenging to provide an electric symbol, which covers the new structure that the current invention provides. FIG. 10 represents a first attempt but might not be fully accurate or complete. In any case the slot antenna 250 is connected via the transmission cable 253 to an RF-transceiver circuit 700 (circuit not shown).

MORE DETAILED IMPLEMENTATION INFORMATION CONCERNING THE INVENTION AND IMPORTANT ASPECTS

The invention uses the principle of a capacitive voltage divider against ground plane below the powerline. The upper plate is electrically connected to the power line, increasing the surface and hence capacitance C1 to the lower plate. The lower plate is floating and forms the upper plate of a stray capacitance C2 against ground as the lower plate. C1 is typically 2-3 decades larger than C2, for example 200 pF to 1 pF. With a capacitive current flowing through the series connection, a major part of the powerline's phase to ground voltage lies across C2, leaving a much lower and more useful sensing and harvesting voltage across C1. Connecting a load over C1 reduces its voltage further. One could utilise the energy of the negative half-wave voltage over C1 by implementing a switched-capacitor regulator, but this is not mandatory. However, switching between voltage sensor and harvesting modes, or at least disconnecting the harvester is desirable to allow voltage sensor as the only, high impedance load! C1 may be created by 2 metal parts with or without a dielectric material in the gap. Capacitance C1 can be adjusted by the size and distance of the metal parts and the dielectric in the volume between them. The phase to ground voltage may be 6 kV to 400 kV. A suitable voltage across C1 for connection to a small electronic circuit may be 100 V-1 kV.

For use with high voltage powerlines, corona discharges resulting from the strong electric fields must be taken into account in the mechanical design of the line sensor, as these discharges may disturb sensors, electronics and radio links, and strongly increase ozone generation which is highly corrosive and accelerate ageing of many materials in a similar way as UV light—with oxidation. Synthetic materials for the housing, like plastics, must be selected carefully for long life. Also, there are EMC requirements to power lines as corona discharges also emit radio interference, with highest energy below 2 MHZ, falling linearly to 500 MHz and beyond to 2-3 GHZ.

The simple design rule to limit corona discharges is to have a rounded outer surface with maximum radius, no sharp corners or edges. Metal or other conductive material at outside will work but isolated materials allows reduced radius in many cases—as exemplified by high voltage isolator strings and discs. Even so, the conductive parts inside the isolating case must also follow the same rules seen from the outside. Protruding antennas like the one found in [Efi07], metal edges as also found in the outer plane of [Efi07], rectangle corners as found in the casing of [Efi07], and all other screws and bolts at outside increases corona discharges. The addition of a larger object close to the powerline has the effect of increasing the effective radius of the powerline and may reduce corona locally at the powerline itself. Corona onset occurs at 30-32 kV/cm according to Peek's law:

https://en.wikipedia.org/wiki/Peek%27s_law (see also page 348 in 2nd reference of wiki for details.

So a low voltage of 100 V between the capacitor plates 244 and 242 of the printed circuit board 230 at horizontal distances of 1-2 mm in the plane of 244 has no effect and can be regarded as the same potential as the power line reference from a corona point of view.

The line sensor of the current invention is designed for low corona discharges at high voltage powerlines. This is critical for the utility company as they would otherwise exceed EMC regulations like IEC 60383-1 and -2 for "Radio Interference Voltage"—so utility companies have limitations to how much RF noise can be emitted from power lines.

Design Details:

The slot antenna is integrated in the upper plate 242 of C1 which acts as ground reference for the electronics. A bow-tie shape of the slot antenna 250 is advantageous but not required: a rectangular slot will also work. The length should typically be half a wavelength at the selected frequency. As example, at 2.45 GHz that length would be 61.2 mm in air. Width of rectangle or bow-tie may be as little as 3-4 mm in the centre feed point. The rectangle is parallel to the powerline, centred below the powerline. The electric field of the slot antenna is parallel to its short ends. The RF current flows from the middle feed point, both ways around the slot, such that the only net field comes from the short ends. The electric field is orthogonal to both the electric field from the voltage driving the current in the powerline, and from the capacitive stray current in C2 out of lower plate 244 flowing to ground, independent of line inclination.

Adding a cavity backing to a simple planar slot antenna changes the antenna from omnidirectional (radiating to both sides of the plane) to unidirectional, increasing antenna gain. This reduces required transmitted RF power given the same signal path length (range). The antenna main lobe from a horizontal line sensor is vertical down, such that for a line sensor hanging close to a mast at a hyperbolic arc powerline with inclination away from the mast, the main lobe will point directly at the smart module 300 mounted in the same mast 11.

Using horizontal polarisation in local wireless communication networks NWL1, NWL2 improves isolation to the long range main wireless communication network NW1 of FIGS. 1-2, which is vertically polarised. The rule-of-thumb for isolation between orthogonally polarised antennas is about 20 dB, so the slot antenna signal interference to the long range main communication network NW1 is minimised.

The antenna signal from the slot antenna is automatically DC grounded since the antenna pattern itself is at the ground plane for all frequencies lower than the operating range of the antenna. Even so, there are further DC ground components in the RF signal path into the radio, including bandpass filters for the band of interest.

Front section of the line sensor points towards mast, usually upwards and away from midpoint between masts. The larger opening is in the PCB copper plate 244. This outer opening allows full external radiation from the slot antenna at the "inner" plate 242.

Any whip, RubberDuck, quarter-wave, dipole, Yagi and many other antenna designs will have high corona discharges at the sharp end and in general its entire geometry. These antennas also fall short on the DC grounding mentioned elsewhere and would have high voltages at its internal metal structure.

Antenna gain in main lobe is as high as 8 dBi from this cavity backed single slot antenna, creating small "radio cells" with vertical high gain link in NWL2 of FIG. 2 and as low gain as −6 dBi in the horizontal direction used by the long range communication network NW1.

The ground plane extension and chamber is shaped with large outer radius and soft curves, minimising sharp edges and corners and hence minimising corona discharges.

The slot antenna shape itself is a narrow opening in a planar surface of the ground plane, where inner conductive edges are close to each other for low corona. Inner corners and geometries have better corona properties than the inverse.

The invention may use a low cost, standard manufacturable dual layer FR4 printed-circuit board material to create a plate capacitor. FR4 has a dielectric constant $\varepsilon r$ of 3.8 to 4.8, increasing the capacitance by the same factor compared to air with $\varepsilon r$ of 1.0. This has shown to be close to optimum for a harvester voltage up to 100V. A slot antenna opening is etched in the top (ground reference) layer 242, slightly reducing the copper area and hence capacitance. This specific antenna operate in the range 2400-2485 MHz and is designed to be horizontally polarised and orthogonal to the axis of the powerline, such that the polarisation is also independent of the inclination of the powerline and hence the antenna itself.

One advantageous feature of this antenna type is to have the lowest possible induced voltages from the electric and magnetic fields from the powerline, as the E and H fields are orthogonal to both sets of E and H fields in the powerline. Other antenna types require larger DC grounds made by inductors or quarter-wave stubs, but the power frequency fields will still generate a low power frequency voltage at the RF port. Large transient voltages and currents in the powerline from lightning strikes and other faults may exceed RF port ratings even if protected by DC grounds. Adding overvoltage protection components increases signal losses, reducing the sensitivity of the receiver and output power of the transmitter.

The invention has been described in the field of power line sensors. However, the invention may also be used in a wider range of applications, such as other high voltage utility and power electronics applications.

The particular embodiments disclosed above are illustrative only, as the invention may be modified and practiced in different but equivalent manners apparent to those skilled in the art having the benefit of the teachings herein. The invention covers all these variants as long as they are covered by the independent claim. No limitations are intended to the details of construction or design herein shown, other than as described in the claims below. It is therefore evident that the particular embodiments disclosed above may be altered or modified and all such variations are considered within the scope of the invention. Accordingly, the protection sought herein is as set forth in the claims below.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The mere fact that certain measures are recited in mutually different dependent claims does not indicate that a combination of these measures cannot be used to advantage. The invention may be implemented by means of hardware comprising several distinct elements, by software or a combination of these two. In the device claims enumerating several means, several of these means may be embodied by one and the same item of hardware.

The invention claimed is:

1. A line sensor for being mounted to a power line, the line sensor comprising:

a housing for containing line sensor electronics; and an voltage-sensing capacitor in connection with the housing, the voltage-sensing capacitor having two capacitor plates that are placed at a distance from each other for forming a first capacitance, wherein a first, upper, one of the two capacitor plates is configured to be electrically connected with the power line, and a second, lower, one of the two capacitor plates is electrically floating and forms a second, parasitic, capacitance with earth, the line sensor being characterized by an electric circuit being connected in parallel with the first capacitance for receiving a harvested voltage standing over the two capacitor plates, the electric circuit being configured for operating in an energy harvesting mode and/or a voltage-sensing mode, the line sensor being further characterized by a slot antenna being integrated in the first, upper, one of the two capacitor plates, a slot of the slot antenna having two opposing short sides and two opposing long sides, the slot antenna comprising an input terminal at a first one of the long sides of the slot and an output terminal on a second one of the long sides of the slot, wherein in the second, lower, one of the two capacitor plates an opening is provided for allowing radiofrequency waves generated by the slot antenna to be transmitted through the opening.

2. The line sensor according to claim 1, wherein the electric circuit i) is configured for rectifying the harvested voltage to obtain a rectified harvested voltage and ii) for providing the rectified harvested voltage to the line sensor electronics in operational use so as to provide the energy harvesting mode.

3. The line sensor according to claim 1, wherein the electric circuit is configured for measuring the harvested voltage for further handling so as to provide the voltage-sensing mode.

4. The line sensor according to claim 1, wherein the slot antenna is rectangular extending within in a plane of the first, upper, capacitor plate, wherein the short sides of the slot antenna extend in a direction orthogonal to the power line.

5. The line sensor according to claim 1, wherein the slot antenna is bow-tie shaped extending within in a plane of the first, upper, capacitor plate, wherein the short sides of the slot antenna extend in a direction orthogonal to the power line.

6. The line sensor according to claim 1, further comprising a printed-circuit board having an electrically-insulating substrate sandwiched between respective electrically-conductive layers, the electrically-insulating substrate forming the dielectric of the first capacitor, the first capacitor being integrated in the printed-circuit board by each capacitor plate being provided in a respective one of the electrically-conductive layers and the slot antenna-being integrated in only one of the electrically-conductive layers.

7. The line sensor according to claim 1, wherein a top-side of the housing is pre-shaped so as to receive and align with the power line from which the line sensor is suspended in operational use.

8. The line sensor according to claim 1, wherein the first capacitor with the slot antenna is placed in the housing such that the slot antenna is located right under and in parallel with the power line in operational use of the line sensor.

9. The line sensor according to claim 1, wherein the housing comprises electrically-insulating material on the outside.

10. The line sensor according to claim 9, wherein an inner side of the housing above the slot antenna is provided with an electrically-conductive layer.

11. The line sensor according to claim 10, wherein an electrically-conductive via is provided on a top side of the housing and extends through the electrically-insulating material for making an electrical connection between the electrically-conductive layer and the power line.

12. The line sensor according to claim 10, further comprising vias in a printed-circuit board for connecting the first capacitor plate to the conductive layer on an inside of the housing for forming a Faraday cage around internal electronics and wiring for shielding against electric fields.

13. The line sensor according to claim 12, wherein a bottom side of the housing located under the slot antenna is not provided with any electrically-conductive layer so as to allow radio-frequency waves to be transmitted through a lower part of the housing.

14. The line sensor according to claim 11, wherein the electrically conductive layer of the housing, the electrically-conductive via and the upper capacitor plate define an antenna cavity formed above the slot antenna, the antenna cavity being provided for reflecting radio-frequency waves that are emitted from the slot antenna in a direction of the power line, in operational use of the line sensor.

15. The line sensor according to claim 1, further comprising an RF-transceiver circuit coupled with the slot antenna for allowing wireless communication with other units.

16. The line sensor according to claim 2, wherein the electric circuit is configured for measuring the harvested voltage for further handling so as to provide the voltage-sensing mode.

17. The line sensor according to claim 11, further comprising vias in a printed-circuit board for connecting the first capacitor plate to the conductive layer on an inside of the housing for forming a Faraday cage around internal electronics and wiring for shielding against electric fields.

* * * * *